United States Patent
Hsu et al.

(10) Patent No.: US 10,128,304 B2
(45) Date of Patent: Nov. 13, 2018

(54) ISOLATION FOR SEMICONDUCTOR DEVICES

(71) Applicant: Taiwan Semiconductor Manufacturing Company, Ltd., Hsin-Chu (TW)

(72) Inventors: Wen-I Hsu, Tainan (TW); Min-Feng Kao, Chiayi (TW); Jen-Cheng Liu, Hsin-Chu (TW); Dun-Nian Yaung, Taipei (TW); Tzu-Hsuan Hsu, Kaohsiung (TW); Wen-De Wang, Minsyong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/930,183

(22) Filed: Nov. 2, 2015

(65) Prior Publication Data
US 2016/0056202 A1 Feb. 25, 2016

Related U.S. Application Data

(62) Division of application No. 13/598,275, filed on Aug. 29, 2012, now Pat. No. 9,177,986.

(51) Int. Cl.
| | | |
|---|---|---|
| *H01L 21/76* | (2006.01) | |
| *H01L 27/146* | (2006.01) | |
| *H01L 29/06* | (2006.01) | |
| *H01L 21/762* | (2006.01) | |
| *H01L 21/761* | (2006.01) | |

(52) U.S. Cl.
CPC ...... *H01L 27/14689* (2013.01); *H01L 21/761* (2013.01); *H01L 21/76237* (2013.01); *H01L 27/1463* (2013.01); *H01L 29/0649* (2013.01); *H01L 27/14643* (2013.01)

(58) Field of Classification Search
CPC .................. H01L 21/76237; H01L 29/0649
USPC ............... 257/398–400, 506, 509, 544, 545; 438/404, 405, 407, 424–426, 433, 435, 438/445
See application file for complete search history.

(56) References Cited

U.S. PATENT DOCUMENTS

| | | | |
|---|---|---|---|
| H204 H  * | 2/1987 | Oh ............................... | 257/397 |
| 6,140,691 A | 10/2000 | Gardner et al. | |
| 2003/0098491 A1* | 5/2003 | Tsutsumi .......... | H01L 21/76237 257/506 |

* cited by examiner

*Primary Examiner* — Matthew E Warren
(74) *Attorney, Agent, or Firm* — Slater Matsil, LLP (57) ABSTRACT

A system and method for isolating semiconductor devices is provided. An embodiment comprises an isolation region that is laterally removed from source/drain regions of semiconductor devices and has a dielectric material extending over the isolation implant between the source/drain regions. The isolation region may be formed by forming an opening through a layer over the substrate, depositing a dielectric material along the sidewalls of the opening, implanting ions into the substrate after the deposition, and filling the opening with another dielectric material.

23 Claims, 12 Drawing Sheets

ISOLATION FOR SEMICONDUCTOR DEVICES

This application is a divisional of U.S. patent application Ser. No. 13/598,275, filed on Aug. 29, 2012, and entitled "Isolation for Semiconductor Devices," which application is hereby incorporated herein by reference.

BACKGROUND

Complementary metal oxide semiconductor image sensors generally utilize a series of photodiodes formed within an array of pixel regions of a semiconductor substrate in order to sense when light has impacted the photodiode. Adjacent to each of the photodiodes within each of the pixel regions a transfer transistor may be formed in order to transfer the signal generated by the sensed light within the photodiode at a desired time. Such photodiodes and transfer transistors allow for an image to be captured at a desired time by operating the transfer transistor at the desired time.

The complementary metal oxide semiconductor image sensors may generally be formed in either a front side illumination configuration or a back-side illumination configuration. In a front-side illumination configuration light passes to the photodiode from the "front" side of the image sensor where the transfer transistor has been formed. However, forcing the light to pass through any overlying metal layers, dielectric layers, and past the transfer transistor before it reaches the photodiode may generate processing and/or operational issues as the metal layers, dielectric layers, and the transfer transistor may not necessarily be translucent and easily allow the light to pass through.

In a back-side illumination configuration, the transfer transistor, the metal layers, and the dielectric layers are formed on a the front side of the substrate, and light is allowed to pass to the photodiode from the "back" side of the substrate such that the light hits the photodiode before it reaches the transfer transistor, the dielectric layers, or the metal layers. Such a configuration may reduce the complexity of the manufacturing of the image sensor and its operation.

However, without proper isolation between the various devices and transistors, the image sensor may not operate as efficiently as desired. In particular, as the size and pitch of pixels within an image sensor scale down, noise between the devices becomes more of a problem, and improper isolation can allow an undesirable junction leakage between the devices.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely an isolation region for a complementary metal oxide semiconductor (CMOS) image sensor. Other embodiments may also be applied, however, to other isolation regions for other types of devices.

Figure 1:
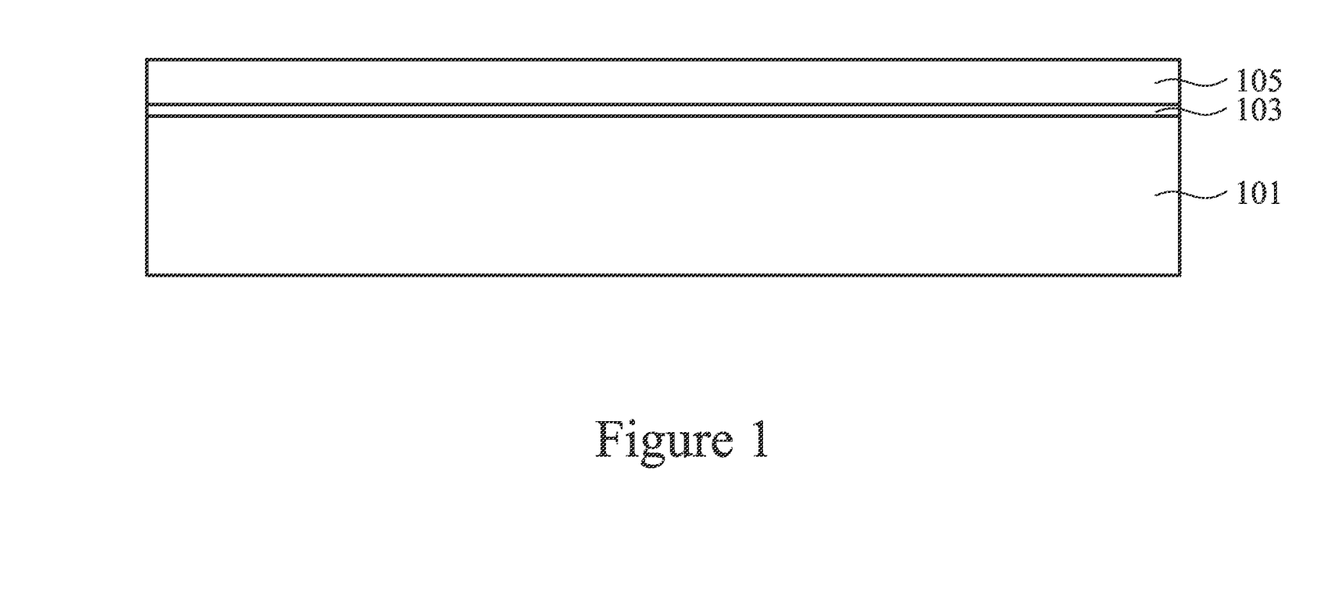
FIG. 1 illustrates a substrate with a gate dielectric layer and a conductive layer in accordance with an embodiment.

With reference now to FIG. 1, there is shown a cross-sectional, simplified view of a substrate 101 with a gate dielectric layer 103 and a conductive layer 105 over the substrate 101. The substrate 101 may comprise a semiconductor material such as silicon, germanium, diamond, or the like, with a crystal orientation of (110). Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the substrate 101 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 101 may be doped with a p-type dopant, such as boron, aluminum, gallium, or the like, although the substrate may alternatively be doped with an n-type dopant, as is known in the art.

Gate dielectric layer 103 and conductive layer 105 may be formed on the substrate 101 by any suitable process known in the art. The gate dielectric layer 103 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The gate dielectric layer 103 may have a relative permittivity value greater than about 4.

In an embodiment in which the gate dielectric layer 103 comprises an oxide layer, the gate dielectric layer 103 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the gate dielectric layer 103 may be between about 10 Å to about 150 Å in thickness, such as 100 Å in thickness.

The conductive layer 105 may comprise a conductive material, such as doped poly-crystalline silicon, a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), other conductive materials, or a combination thereof. In one example, amorphous silicon is deposited and recrystallized to create poly-crystalline silicon (poly-silicon). In an embodiment in which the conductive layer 105 is poly-silicon, the conductive layer 105 may be formed by depositing doped or undoped poly-silicon by low-pressure chemical vapor deposition (LPCVD) to a thickness in the range of about 100 Å to about 2,500 Å, such as 1,000 Å.

Figure 2:
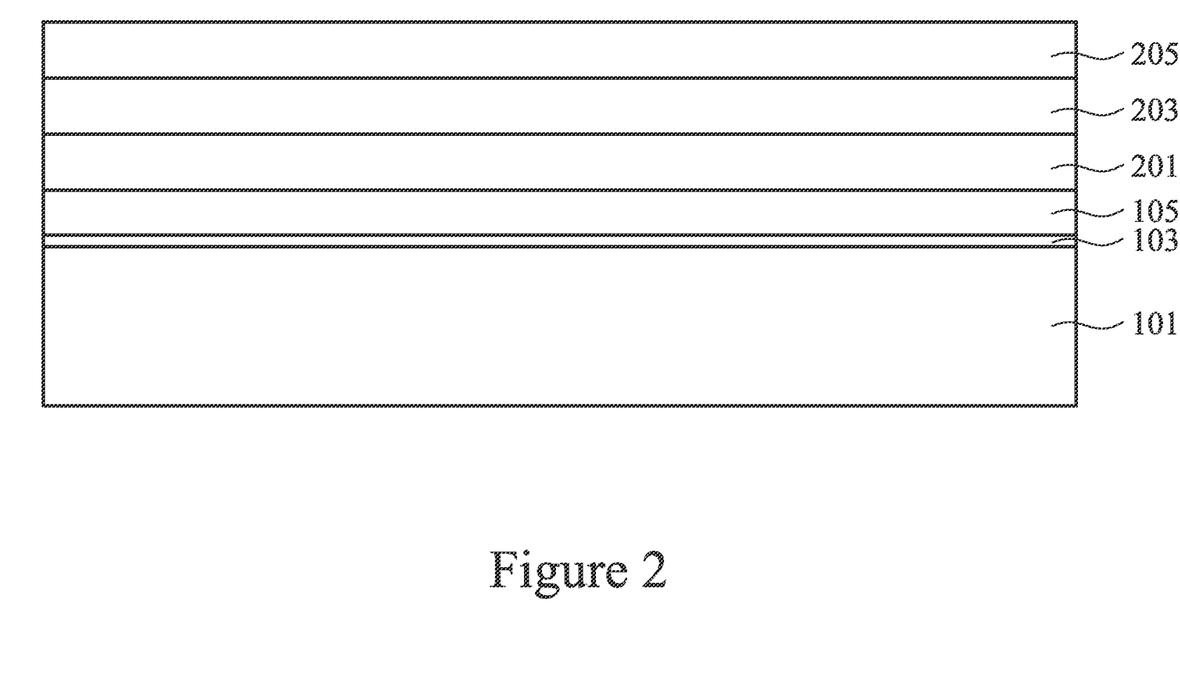
FIG. 2 illustrates a formation of a first hardmask layer, an AFP layer, and a second hardmask layer in accordance with an embodiment.

FIG. 2 illustrates a formation of a first hardmask layer 201, an advanced patterning film (APF) layer 203, and a second hardmask layer 205. The first hardmask layer 201 may be a masking material such as silicon nitride, and may be formed using a process such as plasma enhanced chemical vapor deposition (PECVD). However, any other suitable hardmask material, such as silicon oxide, and any other process of formation, such as chemical vapor deposition (CVD), may alternatively be utilized. In an embodiment the first hardmask layer 201 may be formed to a thickness of between about 500 Å and about 5000 Å, such as about 1900 Å.

The APF layer 203 may be utilized for critical dimension control in order to obtain and control the desired dimensions of the isolation regions 503 (not illustrated in FIG. 2 but illustrated and discussed below with respect to FIG. 5). In an embodiment the APF layer 203 may comprise amorphous carbon formed by a chemical vapor deposition (CVD) process, although other suitable materials and methods of formation may alternatively be utilized. The APF layer 203 may be formed to a thickness of between about 500 Å and about 5000 Å, such as about 2000 Å.

The second hardmask layer 205 may be a hardmask utilized to help pattern the APF layer 203, and may be a masking material such as silicon oxynitride, although other suitable materials, such as silicon oxide or silicon nitride, may alternatively be utilized, and may be formed a process such as CVD. However, any other suitable processes and thicknesses may alternatively be utilized. In an embodiment the second hardmask layer 205 may be formed to a thickness of between about 100 Å and about 500 Å, such as about 410 Å.

Figure 3:
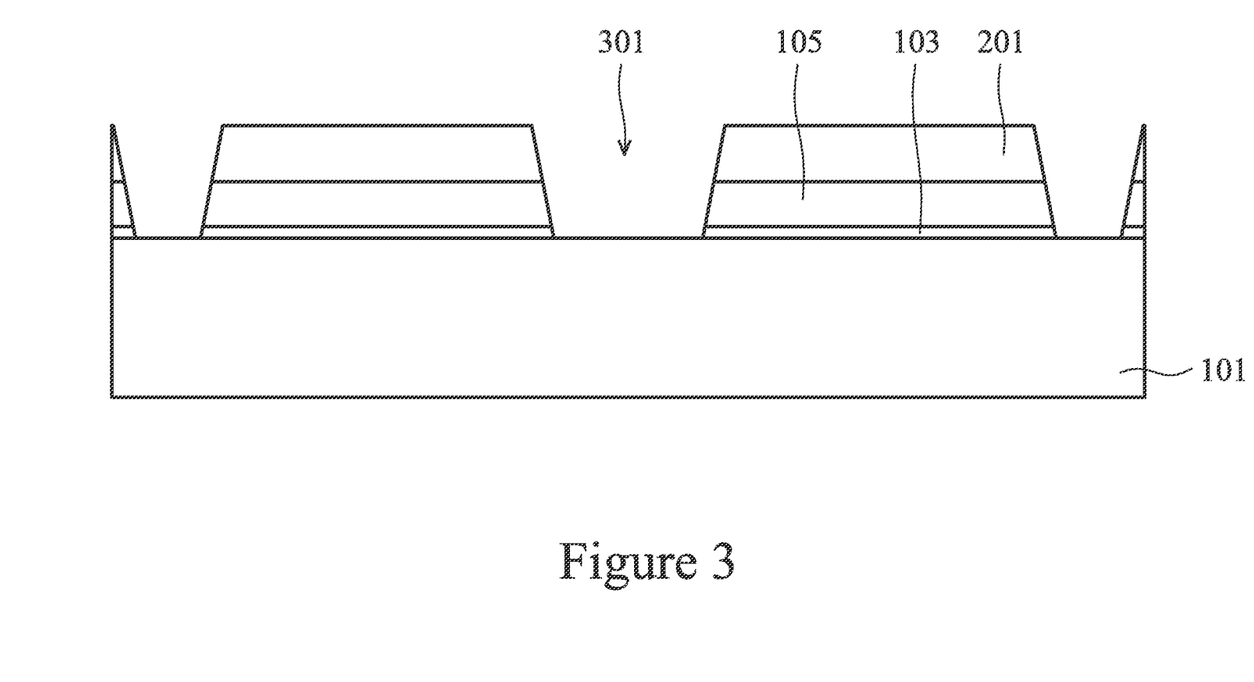
FIG. 3 illustrates a patterning of the first hardmask layer, the conductive layer, and the gate dielectric layer in accordance with an embodiment.

FIG. 3 illustrates a resulting structure after the second hardmask layer 205, the APF layer 203, the first hardmask layer 201, the conductive layer 105, and the gate dielectric layer 103 have been patterned. In an embodiment the second hardmask layer 205 may be patterned using a first photoresist (not individually illustrated in FIG. 3) in a photolithographic masking and etching process. In such a process the first photoresist may be placed on the second hardmask layer 205. The first photoresist may comprise a conventional photoresist material, such as a deep ultra-violet (DUV) photoresist, and may be deposited on the surface of the second hardmask layer 205, for example, by using a spin-on process to place the first photoresist. However, any other suitable material or method of forming or placing the first photoresist may alternatively be utilized. Once the first photoresist has been placed on the second hardmask layer 205, the first photoresist may be exposed to energy, e.g. light, through a patterned reticle in order to induce a reaction in those portions of the first photoresist exposed to the energy. The first photoresist may then be developed, and portions of the first photoresist may be removed, exposing a surface of the second hardmask layer 205, which may then be etched to remove the exposed portions, thereby patterning the second hardmask layer 205.

Once the second hardmask layer 205 has been patterned, the pattern may be transferred to the APF layer 203 using, e.g., a dry etch using a mixture of $H_2/N_2/CO$. In an embodiment the transfer of the pattern may be performed using, e.g., a dry etch process, whereby reactive ions are directed towards the APF layer 203 with the overlying second hardmask 205. With the patterned second hardmask layer 205 overlying the APF layer 203, the patterned second hardmask 205 will block the reactive ions, thereby allowing reactions to occur where the APF layer 203 is exposed by the patterned second hardmask layer 205, thereby transferring the pattern of the second hardmask layer 205 to the APF layer 203.

After the APF layer 203 has been patterned, the pattern may be transferred from the APF layer 203 to the first hardmask layer 201. In an embodiment the transfer of the pattern may be performed using, e.g., a dry etch process, whereby reactive ions are directed towards the first hardmask layer 201 with the overlying patterned APF layer 203. With the patterned APF layer 203 overlying the first hardmask layer 201, the patterned APF layer 203 will block the reactive ions, thereby allowing reactions to occur where the first hardmask layer 201 is exposed by the patterned APF layer 203, thereby transferring the pattern of the APF layer 203 to the first hardmask layer 201.

Once the first hardmask layer 201 has been patterned, the first hardmask layer 201 may be utilized to pattern the conductive layer 105 and the gate dielectric layer 103 and to expose the substrate 101. In an embodiment the transfer of the pattern may be performed using, e.g., a dry etch process, whereby reactive ions are directed towards the conductive layer 105 and the gate dielectric layer 103 with the overlying first hardmask layer 201. With the patterned first hardmask layer 201 overlying the conductive layer 105 and the gate dielectric layer 103, the patterned first hardmask layer 201 will block the reactive ions, thereby allowing reactions to occur where the conductive layer 105 and the gate dielectric layer 103 is exposed by the patterned first hardmask layer 201, thereby transferring the pattern of the first hardmask layer 201 to the conductive layer 105 and the gate dielectric layer 103 and exposing the underlying substrate 101.

During the patterning of the gate dielectric layer 103, the conductive layer 105, and the first hardmask layer 201, trenches 301 are formed. These trenches are formed over an exposed region of the substrate 101, and have sidewalls that comprise the gate dielectric layer 103, the conductive layer 105, and the first hardmask layer 201. Additionally, with the use of the APF layer 203, the trenches 301 may have a width at the top of the first hardmask layer 201 of between about 0.08 µm and about 0.6 µm, such as about 0.2 µm, and may have an aspect ratio of between about 0.5 and about 3, such as about 1.4.

Once the trenches 301 have been formed, the first photoresist, the second hardmask layer 205, and the APF layer 203 may be removed from the first hardmask layer 201. In an embodiment the first photoresist may be removed using an ashing process, whereby the temperature of the first photoresist is increased until it chemically degrades and may be removed. The second hardmask layer 205 and the APF layer 203 may be removed using one or more suitable etchants and etching processes to remove the second hardmask layer 205 and the APF layer 203 from the first hardmask layer 201. Additionally, the first hardmask layer 201 may have its thickness reduced to between about 1500 Å and about 1900 Å, such as about 1600 Å.

Figure 4:
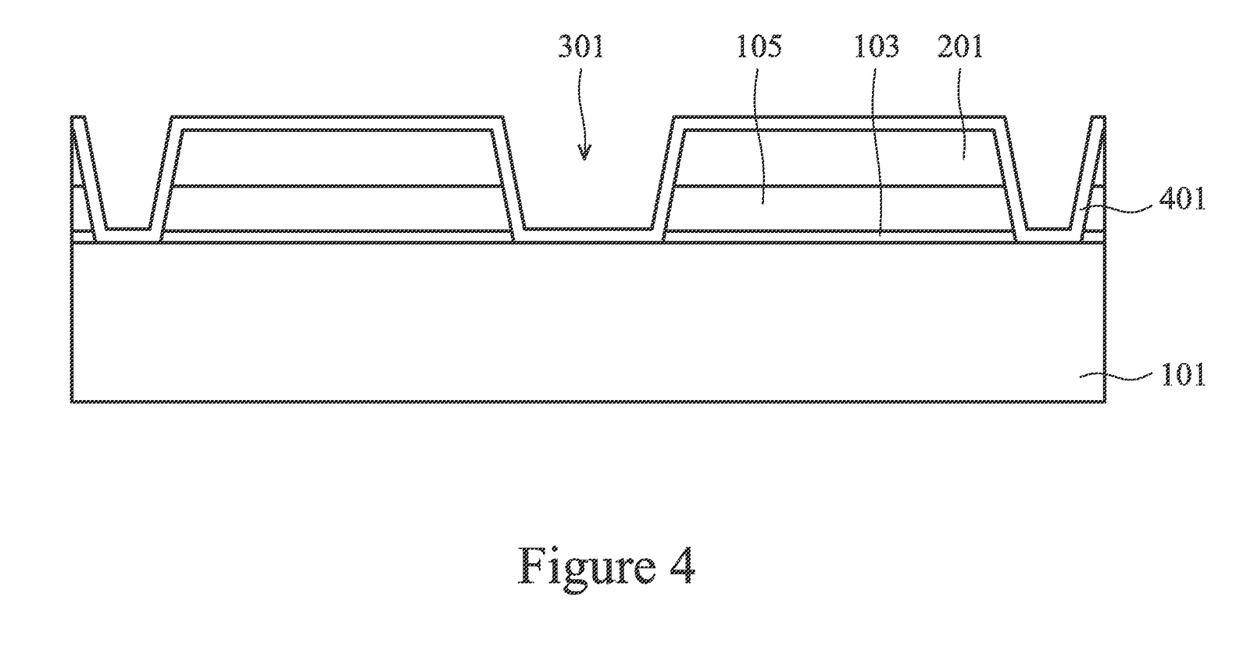
FIG. 4 illustrates a formation of a first dielectric layer in accordance with an embodiment.

FIG. 4 illustrates the formation of a first dielectric layer 401 in and along the sidewalls of the trenches 301. In an embodiment the first dielectric layer 401 may be a dielectric material such as silicon oxide, although other suitable dielectric materials may alternatively be utilized. In an embodiment in which the first dielectric layer 401 is silicon oxide, the first dielectric layer 401 may be formed by a furnace oxidation process, whereby the substrate 101 is placed into a oxygen containing ambient atmosphere and the temperature is increased to react exposed surfaces of the substrate 101, the gate dielectric layer 103, the conductive layer 105, and the first hardmask layer 201 to form the first dielectric layer 401. However, any suitable process for forming the first dielectric layer 401, such as CVD, PVD, or the like, may alternatively be utilized. The first dielectric layer 401 may be formed to a thickness of between about 0.02 µm and about 0.2 µm, such as about 0.05 µm.

Figure 5:
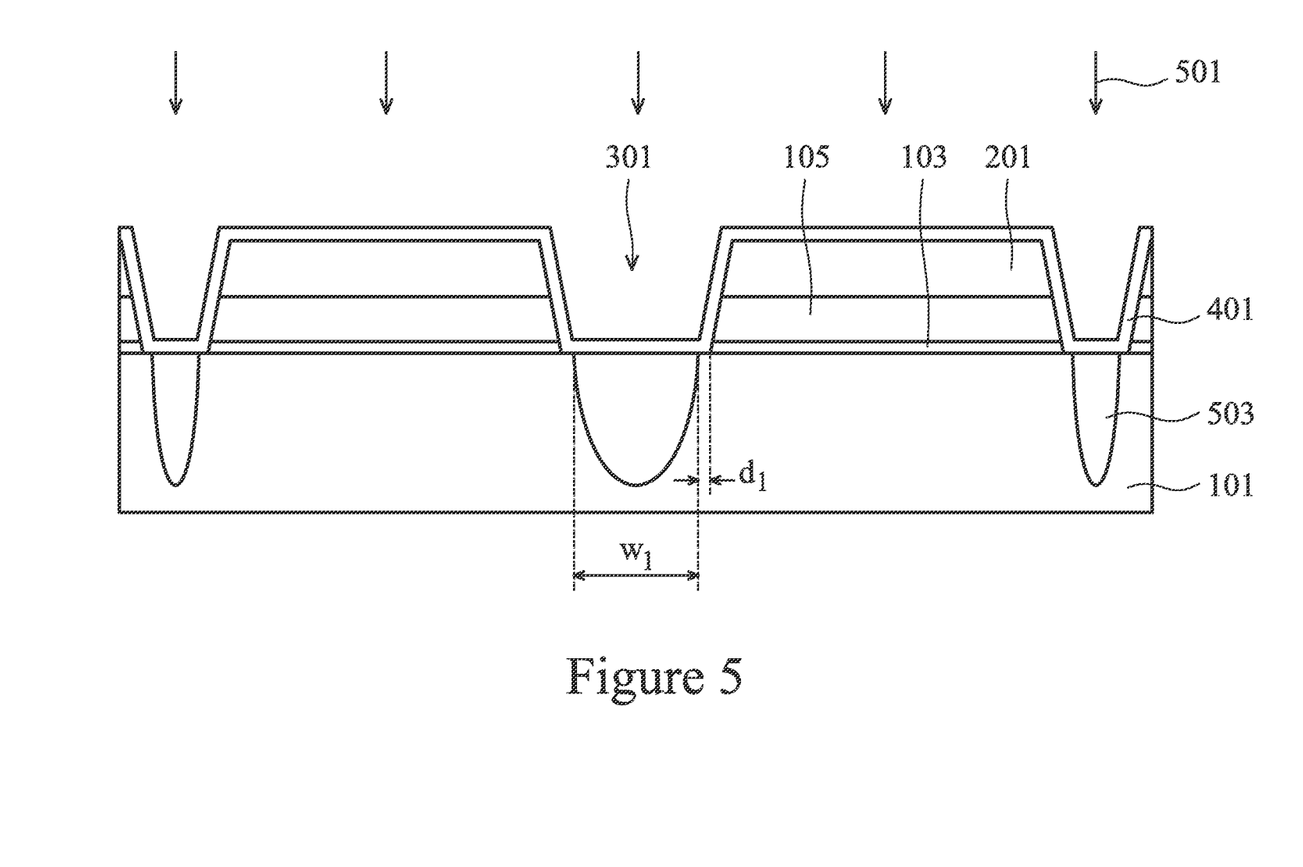
FIG. 5 illustrates an implantation to form isolation regions in accordance with an embodiment.

FIG. 5 illustrates an isolation implantation (represented in FIG. 5 by the arrows labeled 501) through the first dielectric layer 401 and the trenches 301 to form isolation regions 503 within the substrate 101. In an embodiment, the isolation regions 503 may be formed using a process such as ion implantation through the trenches 301 in order to implant an isolation ion such as boron, although any suitable isolation ion, such as aluminum or gallium may alternatively be utilized. In an embodiment in which boron is implanted, the ion implantation of the dopants for the isolation regions 503 may be performed using a precursor such as $BF_3$, at a flow rate of between about 0.5~1.0 sccm. With the precursor supplied, the implantation may occur at a energy of between about 30 KeV and about 100 KeV, such as about 70 KeV, while the temperature may be held below 60° C. The implantation to form the isolation regions 503 may be continued until the isolation regions 503 have a concentration of between about 1E11 at/$cm^{-2}$ and about 1E13 at/$cm^{-2}$, such as about 4.7E12 at/$cm^{-2}$. The isolation regions 503 may be formed to have a first depth from the surface of the substrate 101 of between about 1200 Å and about 3500 Å, such as about 2200 Å, and may have a first width w1 of between about 0.08 µm and about 0.6 µm, such as about 0.2 µm.

Additionally, with the inclusion of the first dielectric layer 401 along the sidewalls of the trench 301, the isolation implantation 501 will form the isolation regions 503 as being aligned with the inner sidewalls of the first dielectric layer 401 and laterally removed from the sidewalls of the trenches 301. In an embodiment, this lateral displacement may be a first distance $d_1$ of between about 0.02 µm and about 0.2 µm, such as about 0.05 µm.

Figure 6:
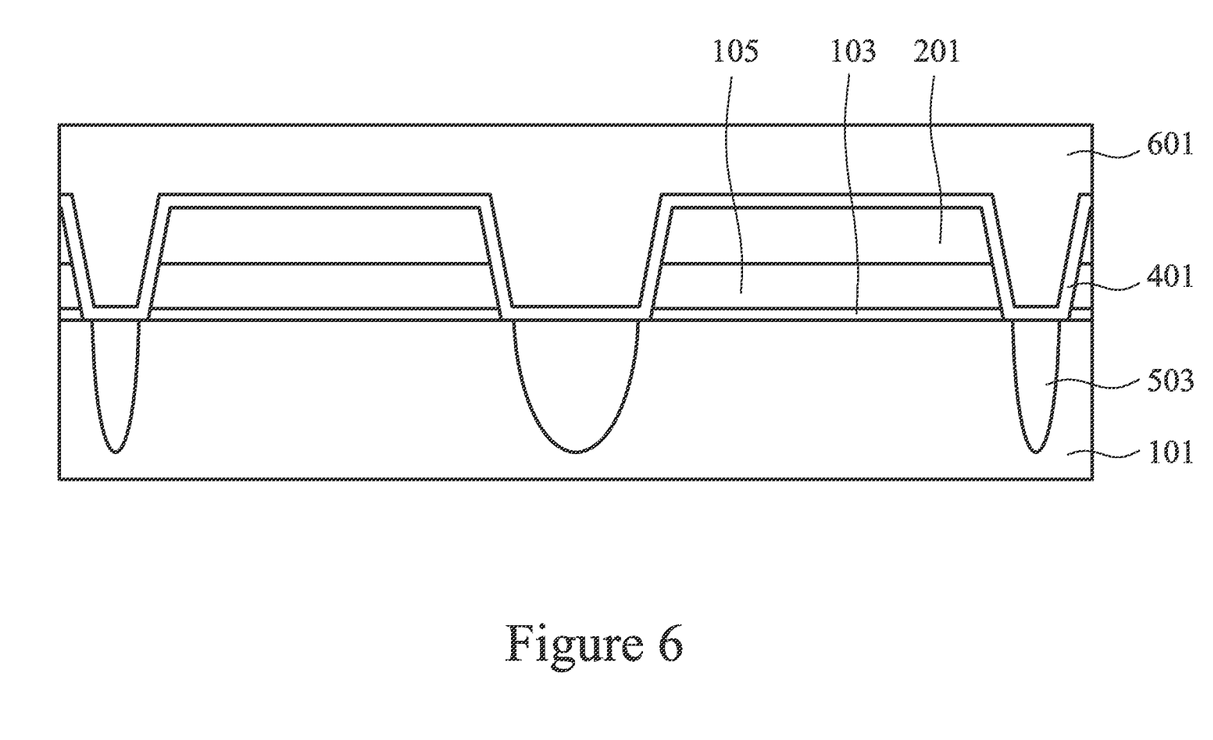
FIG. 6 illustrates the formation of a second dielectric layer in accordance with an embodiment.

FIG. 6 illustrates the formation of a second dielectric layer 601 over the first dielectric layer 401 after the isolation implantation 501. In an embodiment the second dielectric layer 601 may be a similar material as the first dielectric layer 401. For example, in an embodiment in which the first dielectric layer 401 is silicon oxide, the second dielectric layer 601 may similarly be silicon oxide. However, other suitable dielectric material that is not the same as the first dielectric layer 401, such as silicon nitride, may alternatively be utilized.

The second dielectric layer 601 is formed to fill and overfill the trenches 301. The second dielectric layer 601 may be formed using, e.g., a deposition process such as plasma enhanced chemical vapor deposition (PECVD), although any suitable process may be utilized. The second dielectric layer 601 may be formed to have a thickness of between about 3000 Å and about 7000 Å, such as about 5500 Å over the first hardmask layer 201.

Figure 7:
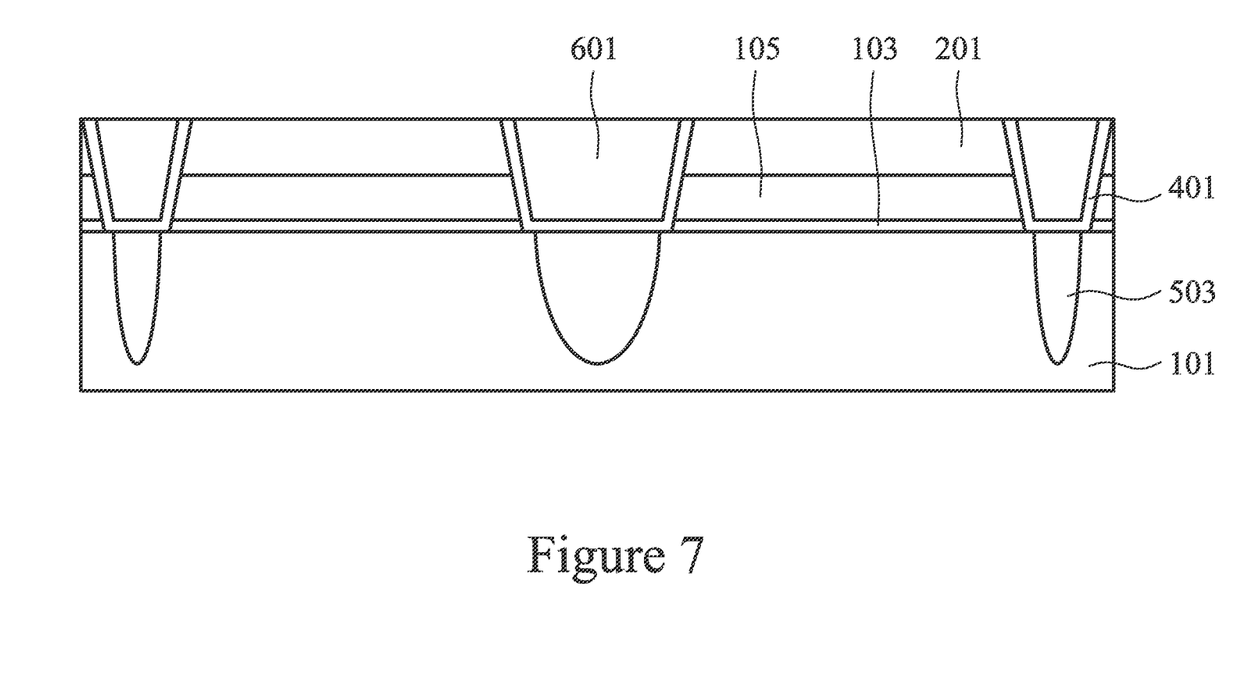
FIG. 7 illustrates a removal of excess material from the second dielectric layer in accordance with an embodiment.

FIG. 7 illustrates a planarization process to remove excess material of the second dielectric layer 601 from outside of the trenches 301. In an embodiment the excess material of the second dielectric layer 601 may be removed using, e.g., a chemical mechanical polishing (CMP) process whereby a combination of etching materials and abrading material are put into contact with the second dielectric layer 601 and a grinding pad (not shown) is used to grind away the second dielectric layer 601 until the excess material has been removed and the first dielectric layer 401 and the second dielectric layer 601 are planar with the first hardmask layer 201. However, any other suitable planarization method may alternatively be utilized. This planarization process embeds the second dielectric layer 601 into the first dielectric layer 401 such that the first dielectric layer 401 surrounds the second dielectric layer 601 within the trenches 301. The planarization process may also reduce the thickness of the first hardmask layer 201 to a thickness of between about 1500 Å and about 1900 Å, such as about 1800 Å.

Figure 8:
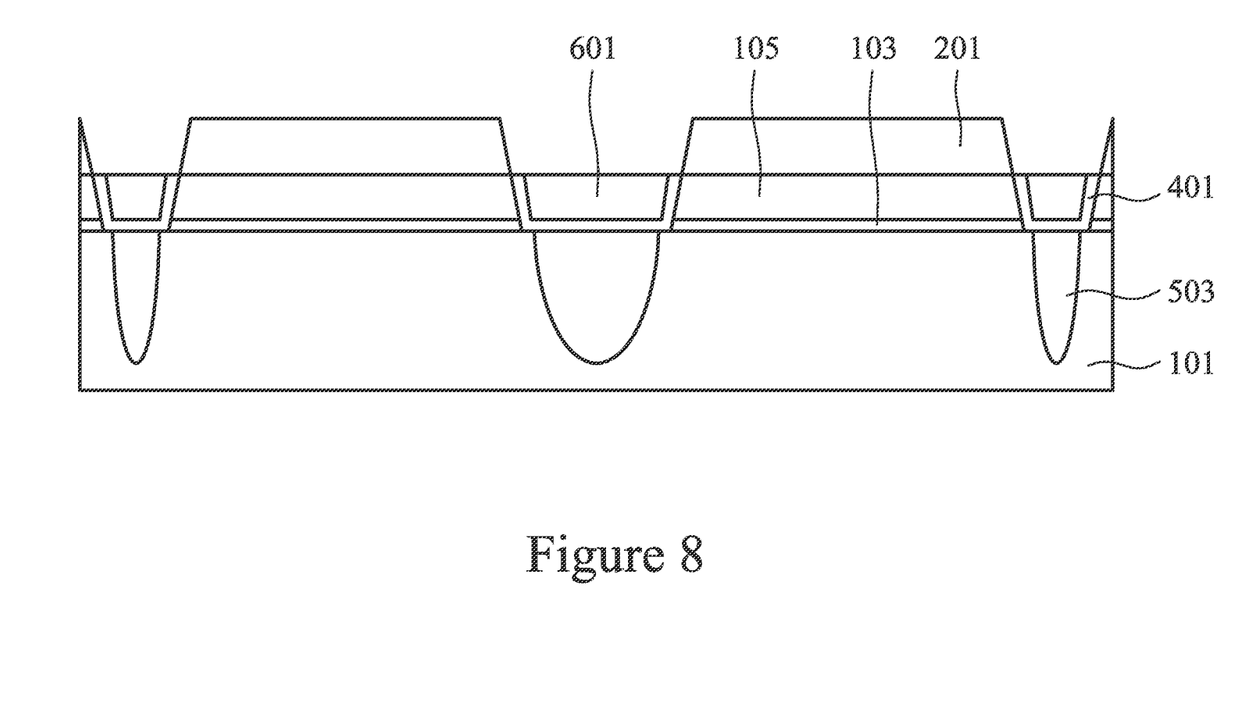
FIG. 8 illustrates a recessing of the first dielectric layer and the second dielectric layer in accordance with an embodiment.

FIG. 8 illustrates a recessing of the first dielectric layer 401 and the second dielectric layer 601 within the trenches 301. In an embodiment the first dielectric layer 401 and the second dielectric layer 601 may be recessed using a wet etch to selectively remove the material of the first dielectric layer 401 and the second dielectric layer 601. In an embodiment in which the first dielectric layer 401 and the second dielectric layer 601 are silicon oxide, the wet etch may utilize an etchant such as HF, DHF, or NH4F to recess the first dielectric layer 401 and the second dielectric layer 601. The recessing may recess the first dielectric layer 401 and the second dielectric layer 601 until the first dielectric layer 401 and the second dielectric layer 601 are planar with the conductive layer 105.

Figure 9:
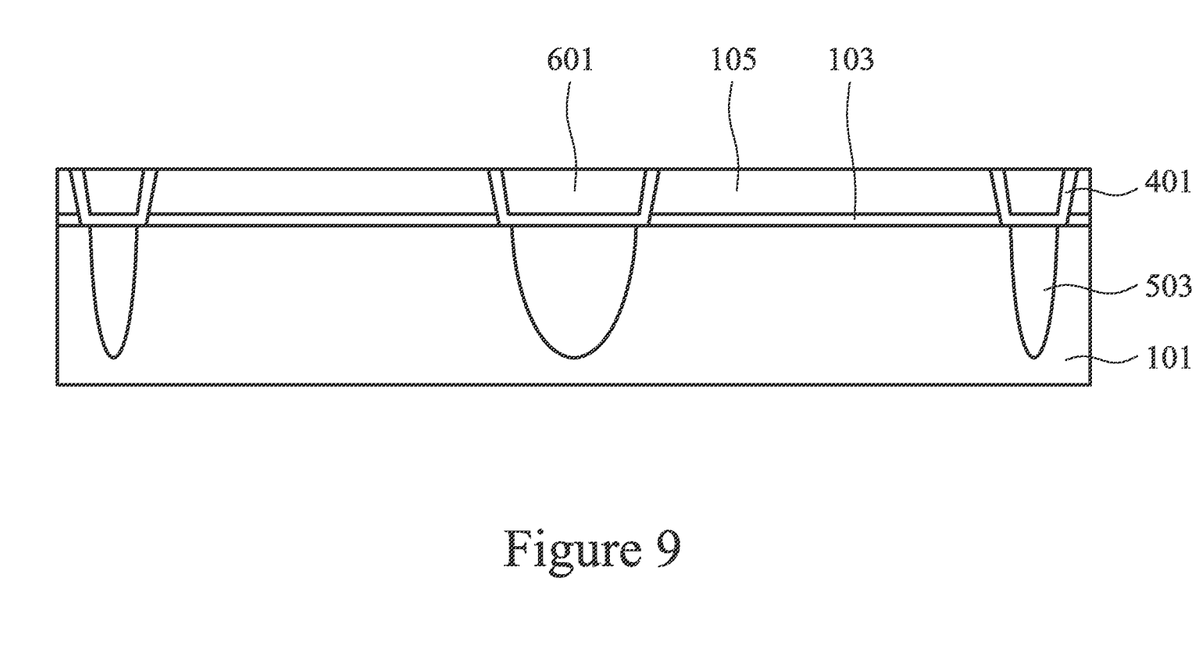
FIG. 9 illustrates a removal of the first hardmask layer in accordance with an embodiment.

FIG. 9 illustrates a removal of the first hardmask layer 201 from the conductive layer 105. In an embodiment the first hardmask layer 201 may be removed using an etchant that is selective to the material of the first hardmask layer 201. For example, in an embodiment in which the first hardmask layer 201 is silicon nitride and the conductive layer 105 is poly-silicon, the first hardmask layer 201 may be removed using an etchant such as $H_3PO_4$. However, any other suitable method or etchants may alternatively be utilized to remove the first hardmask layer.

Figure 10:
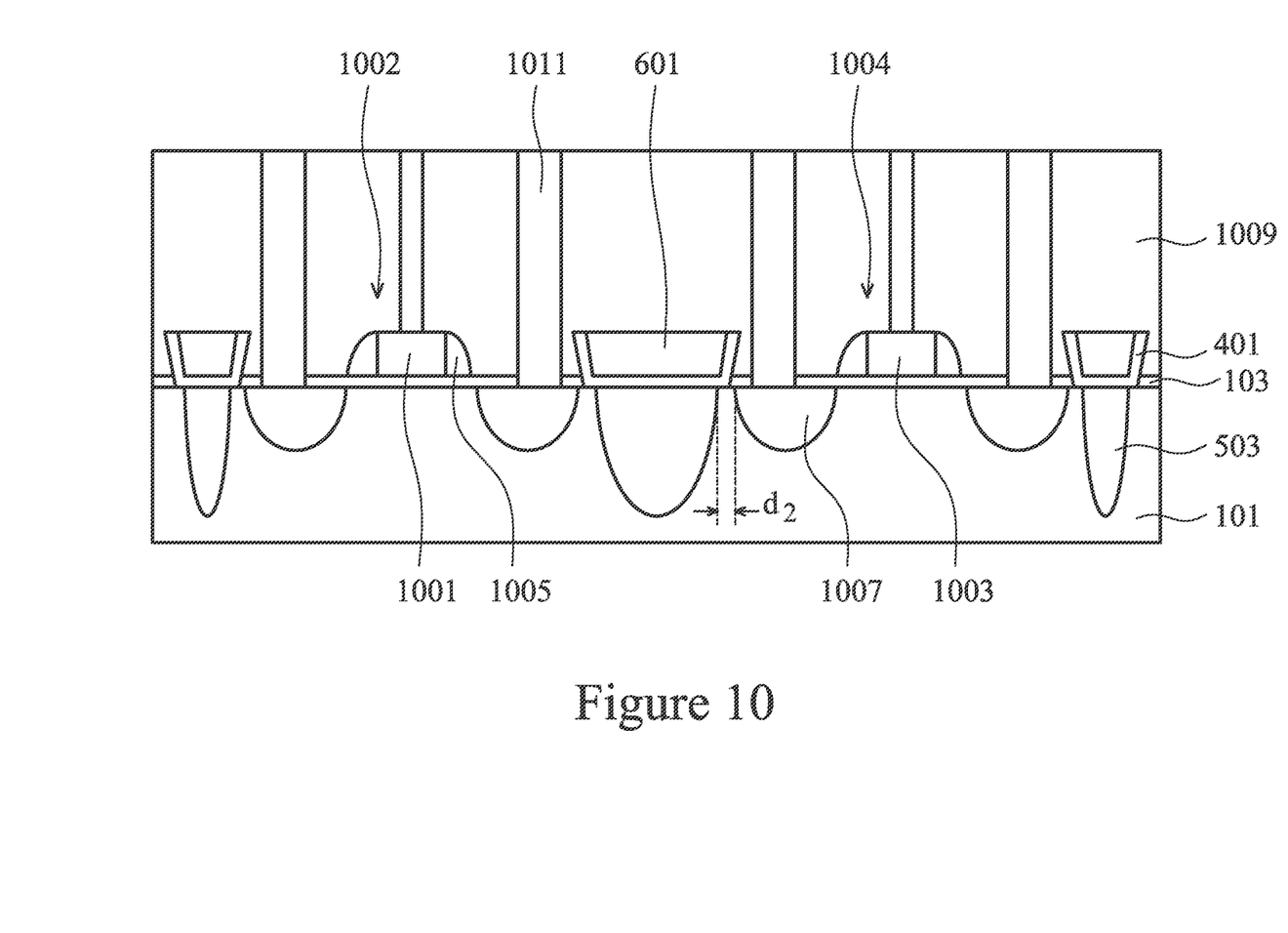
FIG. 10 illustrates the formation of a first transistor and a second transistor in accordance with an embodiment.

FIG. 10 illustrates a patterning of the conductive layer 105 to form a first gate stack 1001 for a first transistor 1002 and a second gate stack 1003 for a second transistor 1004. In an embodiment the conductive layer 105 may be patterned using a suitable photolithographic patterning and etching process, whereby a second photoresist (not illustrated) is placed over the conductive layer 105, exposed to a patterned energy source such as light, and developed to expose areas of the conductive layer 105. Once exposed, those areas of the conductive layer 105 that are desired to be removed are exposed to, e.g., a dry etch process to form the first gate stack 1001 and the second gate stack 1003.

FIG. 10 also illustrates that, after the first gate stack 1001 and the second gate stack 1003 have been formed, spacers 1005 and source/drain regions 1007 may be formed on opposing sides of the first gate stack 1001 and the second gate stack 1003. The spacers 1005 may be formed on the sidewalls of the first gate stack 1001 and the second gate stack 1003. The spacers 1005 are typically formed by blanket depositing a spacer layer (not shown) on the previously formed structure. The spacer layer may comprise SiN, oxynitride, SiC, SiON, oxide, and the like, and may be formed by commonly used methods such as chemical vapor deposition (CVD), plasma enhanced CVD, sputter, and other methods known in the art. The spacer layer is then patterned to form the spacers 1005, such as by anisotropically etching to remove the spacer layer from the horizontal surfaces of the structure.

Source/drain regions 1007 may be formed in the substrate 101 on opposing sides of the first gate stack 1001 and the second gate stack 1003. In an embodiment in which the substrate 101 is a p-type substrate, the source/drain regions 1007 may be formed by implanting appropriate n-type dopants such as phosphorous, arsenic, antimony, or the like. In an embodiment in which the isolation ion is an n-type ion such as boron, the source/drain regions 1007 will have a conductivity that is opposite the isolation regions 503. The source/drain regions 1007 may be implanted using the first gate stack 1001, the second gate stack 1003, and the spacers 1005 as masks to form the source/drain regions 1007.

It should be noted that one of ordinary skill in the art will realize that many other processes, steps, or the like may be used to form the source/drain regions 1007. For example, one of ordinary skill in the art will realize that a plurality of implants may be performed using various combinations of spacers and liners to form the source/drain regions 1007 having a specific shape or characteristic suitable for a particular purpose. Any of these processes may be used to form the source/drain regions 1007, and the above description is not meant to limit the embodiments to the steps presented above.

However, with the first dielectric layer 401 and the second dielectric layer 601 present during the implantations to form the source/drain regions 1007, the first dielectric layer 401 and the second dielectric layer 601 will act as masks and prevent the formation of the source/drain regions 1007 beneath the first dielectric layer 401 and the second dielectric layer 601. This masking causes the source/drain regions 1007 to be laterally removed from the isolation regions 501, thereby increasing the efficiency of the isolation regions 501. In an embodiment the source/drain regions 1007 may be laterally removed from the isolation regions 501 a second distance $d_2$ of between about 0.02 µm and about 0.2 µm, such as about 0.05 µm.

FIG. 10 also illustrates the formation of an inter-layer dielectric (ILD) layer 1009 and contacts 1011 through the ILD layer 1009 to the source/drain regions 1007, the first gate stack 1001, and the second gate stack 1003. The ILD layer 1009 may comprise a material such as boron phosphorous silicate glass (BPSG), although any suitable dielectrics may be used for either layer. The ILD layer 1009 may be formed using a process such as PECVD, although other processes, such as LPCVD, may alternatively be used. The ILD layer 1009 may be formed to a thickness of between about 100 Å and about 3,000 Å.

The contacts 1011 may be formed through the ILD layer 1009 with suitable photolithography and etching techniques. Generally, these photolithography techniques involve depositing a third photoresist (not illustrated), which is masked, exposed, and developed to expose portions of the ILD layer 1009 that are to be removed. The remaining photoresist material protects the underlying material from subsequent processing steps, such as etching. In an embodiment the third photoresist is utilized to create a patterned mask to define contacts 1011. Additional masks, such as a hardmask, may also be used. The etching process may be an anisotropic or isotropic etch process.

Contacts 1011 may then be formed so as to contact the substrate 101, the first gate stack 1001, and the second gate stack 1003. The contacts 1011 may comprise a barrier/adhesion layer (not individually shown in FIG. 10) to prevent diffusion and provide better adhesion for the contacts 1011. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 50 Å to about 500 Å.

The contacts 1011 may be formed of any suitable conductive material, such as a highly-conductive, low-resistive metal, elemental metal, transition metal, or the like. In an embodiment the contacts 1011 are formed of tungsten, although other materials, such as copper, could alternatively be utilized. In an embodiment in which the contacts 1011 are formed of tungsten, the contacts 1011 may be deposited by CVD techniques known in the art, although any method of formation could alternatively be used.

Figure 11:
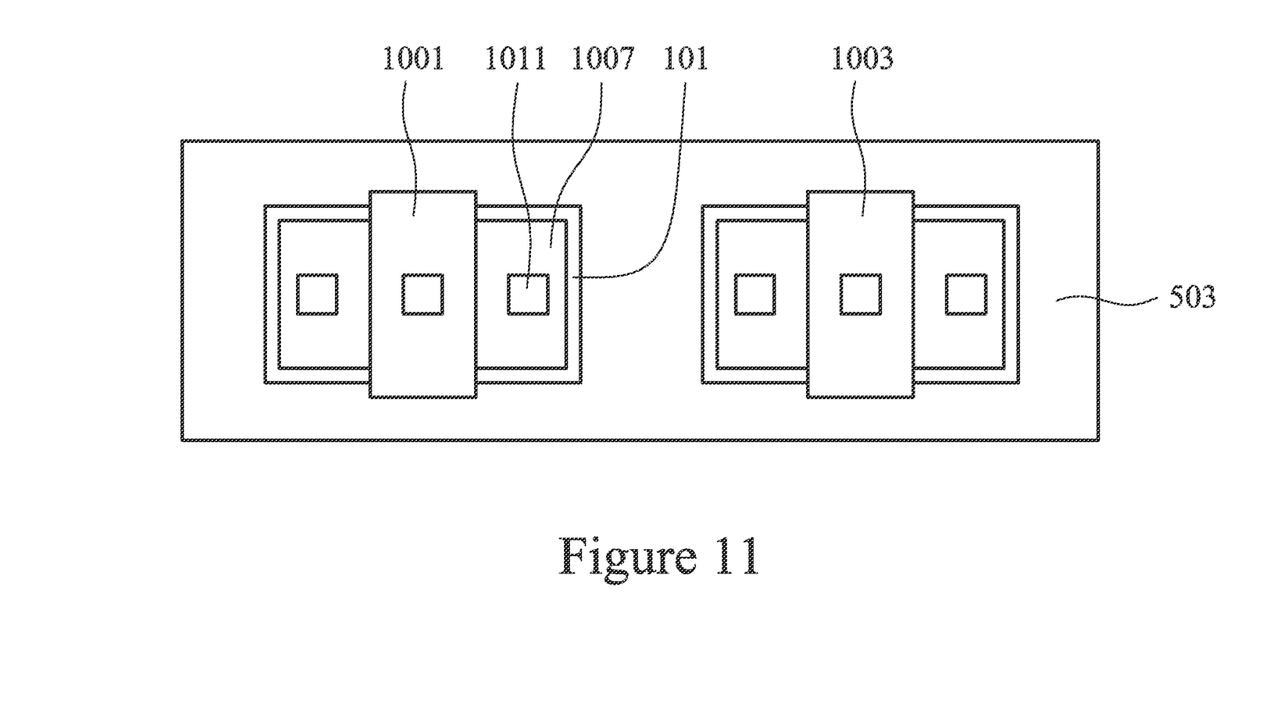
FIG. 11 illustrates a plan view of the first transistor and the second transistor in accordance with an embodiment.

FIG. 11 illustrates a plan view of the isolation regions 501, the first gate stack 1001, the second gate stack 1003, and their associated source/drain regions 1007 (with the ILD layer 1009 removed). As can be seen, the isolation regions 501 surround and isolate the first gate stack 1001 and its associated source/drain region 1007 from the second gate stack 1003 and its associated source/drain region 1007. Additionally, FIG. 11 illustrates the lateral displacement of the isolation regions 503 from the source/drain regions 1007. The contacts 1011 are also illustrated as making contact to the source/drain regions 1007, to the first gate stack 1001, and to the second gate stack 1003.

Figure 12:
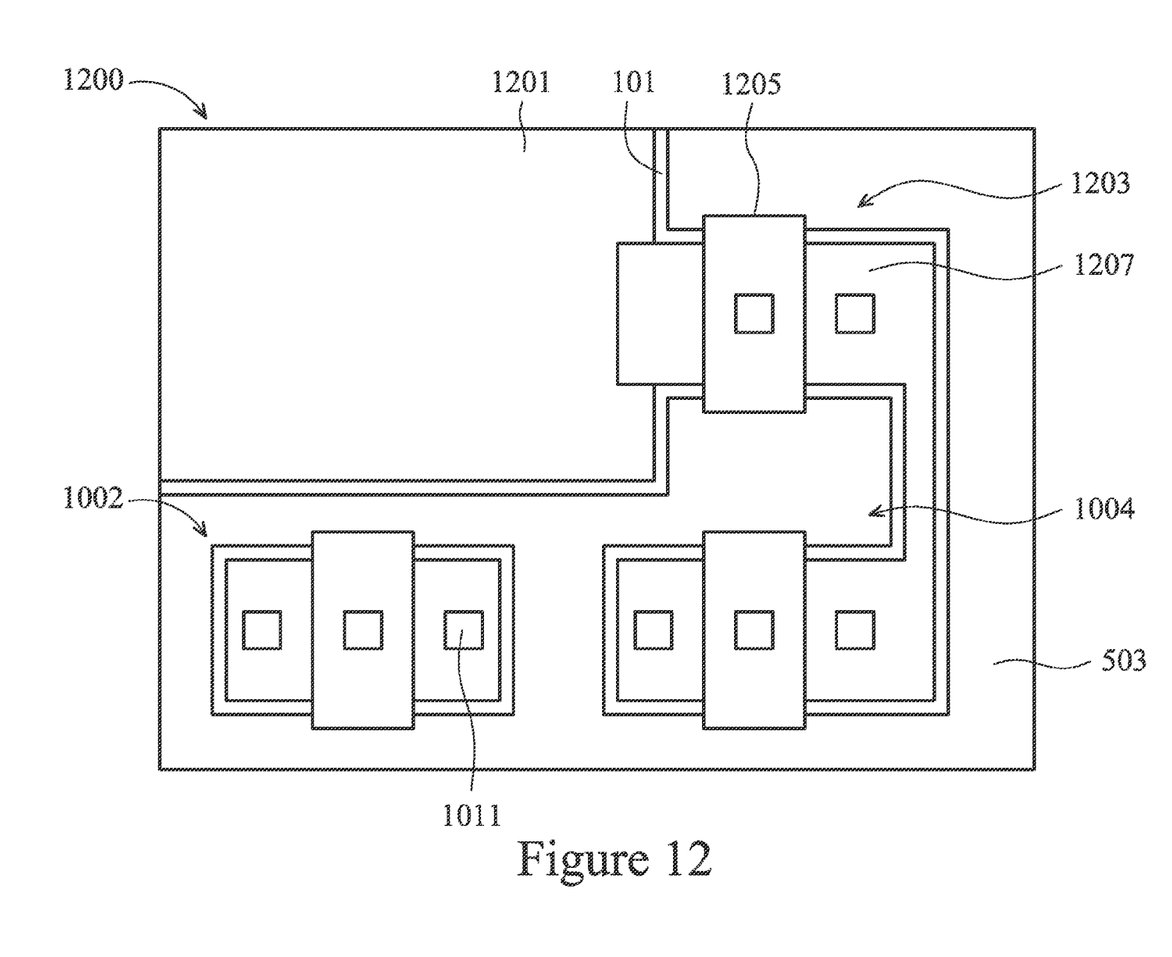
FIG. 12 illustrates a plan view of a pixel incorporating the first transistor and the second transistor in accordance with an embodiment.

FIG. 12 illustrates one possible use for the first transistor 1002 and the second transistor 1004 in a single pixel 1200 of a CMOS image sensor. In an embodiment the pixel 1200 may comprise a photosensitive diode 1201 and a transfer transistor 1203, with the first transistor 1002 and the second transistor 1004 being utilized as a source follower (SF) transistor and a reset transistor, respectively, of the pixel 1200. The transfer transistor 1203 may comprise a third gate stack 1205 and a second source/drain region 1207, which may be formed at the same time and using similar processes as the first gate stack 1001 and the source/drain regions 1007, respectively, although the third gate stack 1205 and the second source/drain region 1207 may alternatively be formed at a different time and using different materials and processes.

The photosensitive diode 1201 may be utilized to generate a signal related to the intensity or brightness of light that impinges on the photosensitive diode 1201. In an embodiment the photosensitive diode 1201 may comprise an n-type doped region formed in the substrate 101 (which in this embodiment may be a p-type substrate) and also may comprise a heavily doped p-type doped region formed on the surface of the n-type doped region to form a p-n-p junction.

The n-type doped region may be formed, e.g., using a photolithographic masking and implantation process. For example, a fourth photoresist (not shown in FIG. 12) may be placed on the substrate 101. The first photoresist, may comprise a conventional photoresist material, such as a deep ultra-violet (DUV) photoresist, and may be deposited on the surface of the substrate 101, for example, by using a spin-on process to place the fourth photoresist. However, any other suitable material or method of forming or placing the fourth photoresist may alternatively be utilized. Once the fourth photoresist has been placed on the substrate 101, the fourth photoresist may be exposed to energy, e.g. light, through a patterned reticle in order to induce a reaction in those portions of the fourth photoresist exposed to the energy. The fourth photoresist may then be developed, and portions of the fourth photoresist may be removed, exposing a portion of the substrate 101 where the photosensitive diode 1201 is desired to be located.

Once the fourth photoresist has been placed and developed, the heavily doped n-type doped region may be formed by implanting n-type dopants (e.g., phosphorous, arsenic, antimony, or the like) through the fourth photoresist. In an embodiment the n-type doped region may be implanted such that their concentration of between about 1e15 atom/cm$^3$ and about 1e20 atom/cm$^3$, such as about 8e15 atom/cm$^3$. However, any suitable alternative concentration for the heavily doped n-type doped region may alternatively be utilized.

After the n-type doped region have been formed (e.g., through the implantation process), the p-type doped region may be formed using, e.g., an ion implantation process using the fourth photoresist as a mask. The p-type doped region may be formed to extend into the substrate 101 between about 1 µm and about 4 µm. Additionally, the p-type doped region may be formed to have a concentration of between about 1e15 atom/cm$^3$ and about 5e19 atom/cm$^3$, such as about 1e16 atom/cm$^3$.

Once the photosensitive diode 1201 has been formed, the fourth photoresist may be removed. In an embodiment, the fourth photoresist may be removed using a process such as ashing, whereby the temperature of the fourth photoresist is raised to a point where the fourth photoresist breaks down and may be easily removed.

By utilizing the embodiments described above to form the isolation regions 503, problems associated with other isolation methods that may use an etching process that causes surface damage and plasma damage may be avoided. Additionally, the embodiments help to reduce or eliminate junction leakage that can occur between the devices and the isolation regions 503.

Further, as one of ordinary skill in the art will recognize, the photosensitive diode 1201 described above is merely one type of photosensitive diode 1201 that may be used in the embodiments. Any suitable photodiode may be utilized with the embodiments, and all of these photodiodes are intended to be included within the scope of the embodiments. Additionally, the precise methods or order of steps described above may be modified, such as by forming the p-type doped region prior to the formation of the n-type doped region, while still remaining within the scope of the embodiments.

Surrounding the photosensitive diode 1201, the transfer transistor 1203, the first transistor 1002, and the second transistor 1004 is the isolation region 503. The isolation region 503 is utilized to help ensure that the individual components that make up the pixel 1200 operate indepently from each other and only communicate with each other as intended and not through an unintended connection through the substrate 101.

In accordance with an embodiment, a semiconductor device comprising an isolation region in a substrate, the isolation region comprising a first type of dopants with a first conductivity, is provided. A first source/drain region is laterally separated from the isolation region, the first source/drain region having a second conductivity different from the first conductivity, and a dielectric material is located over the isolation region and extending laterally no farther than the first source/drain region.

In accordance with another embodiment, a semiconductor device comprising a first implant region and a second implant region within a substrate is provided. An isolation region is between the first implant region and the second implant region, wherein the isolation region is located a lateral distance away from both the first implant region and the second implant region. A dielectric material is over the substrate and extends from the first implant region to the second implant region but does not extend over the first implant region or the second implant region, the dielectric material being located over the isolation region. A first gate stack is adjacent the first implant region and a second gate stack is adjacent the second implant region on an opposite side of the isolation region from the first gate stack.

In accordance with yet another embodiment, a method of manufacturing a semiconductor device comprising forming an opening through one or more layers over a substrate, the opening comprising sidewalls is provided. A first dielectric layer is deposited along the sidewalls of the opening, and first ions are implanted into the substrate using the first dielectric layer as a mask, the implanting first ions forming an isolation region within the substrate.

Although the present embodiments and their advantages have been described in detail, it should be understood that various changes, substitutions and alterations can be made herein without departing from the spirit and scope of the disclosure as defined by the appended claims. For example, many different types of materials and methods may be utilized to form the respective components of the pixel region and other structures described herein.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
forming an opening through one or more layers over a substrate, the opening comprising sidewalls;
depositing a first dielectric layer along the sidewalls of the opening, the first dielectric layer comprising a horizontal portion contacting the substrate and non-horizontal portions contacting the sidewalls, the first dielectric layer having a thickness at the non-horizontal portions; and
implanting first ions into the substrate using the first dielectric layer as a mask, the implanting the first ions forming an isolation region within the substrate, the isolation region having a top surface planar with a major surface of the substrate, the isolation region extending in a horizontal direction starting at one thickness of the first dielectric layer inward from one of the sidewalls and ending at one thickness of the first dielectric layer inward from the other of the sidewalls.

2. The method of claim 1, further comprising filling the opening with a second dielectric layer after the implanting the first ions.

3. The method of claim 2, further comprising:
removing one or more of the one or more layers over the substrate; and
implanting second ions into the substrate using the first dielectric layer and the second dielectric layer as a mask, the implanting the second ions forming a source/drain region laterally removed from the isolation region.

4. The method of claim 1, wherein the forming the opening through one or more layers further comprises:
forming a gate dielectric layer;
forming a gate electrode layer;
forming a first hardmask layer; and
forming the opening through the gate dielectric layer, the gate electrode layer, and the first hardmask layer.

5. The method of claim 4, further comprising patterning the gate electrode layer to form a first gate stack, the first gate stack being part of a first transistor.

6. The method of claim 5, wherein the first transistor is part of a pixel of an image sensor.

7. The method of claim 6, further comprising implanting third ions to form a photosensitive diode within the pixel.

8. The method of claim 1, wherein the horizontal portion of the first dielectric layer comprises a lowermost point, and wherein a portion of the first dielectric layer directly above the lowermost point is above a major surface of the substrate.

9. A method of manufacturing a semiconductor device, the method comprising:
forming an opening through a mask located over a semiconductor substrate;
depositing a first dielectric material along sidewalls of the opening, an entirety of the first dielectric material remaining above a top surface of the semiconductor substrate during the depositing, a bottom portion of the first dielectric material connecting sidewalls of the first dielectric material;
implanting first dopants through the first dielectric material to form an isolation region within the semiconductor substrate, the sidewalls of the first dielectric material blocking the first dopants from reaching the semiconductor substrate;
removing the mask from a region adjacent to the first dielectric material without removing the first dielectric material; and
implanting second dopants using the first dielectric material as a mask to form a source/drain region.

10. The method of claim 9, further comprising filling a remainder of the opening with a second dielectric material after the implanting the first dopants and before the removing the mask.

11. The method of claim 10, further comprising recessing the second dielectric material prior to the removing the mask.

12. The method of claim 10, further comprising planarizing the second dielectric material and the mask prior to the removing the mask.

13. The method of claim 9, wherein the implanting the second dopants forms the source/drain region laterally removed from the isolation region.

14. The method of claim 9, further comprising forming a transistor with the source/drain region.

15. The method of claim 9, wherein during the implanting first dopants, all dopants reaching the semiconductor substrate first pass through the first dielectric material.

16. A method of manufacturing a semiconductor device, the method comprising:
depositing a mask layer over a substrate, a top surface of the mask layer being a first distance from the substrate;
patterning the mask layer to form an opening and expose a portion of the substrate;
lining the opening with a dielectric material, a lowermost portion of the dielectric material having a top surface, the top surface having a first depth being less than the first distance;
performing a first implantation through the dielectric material to form a first implanted region within the substrate;
filling the opening with a first material after the performing the first implantation; and
performing a second implantation after the performing the first implantation to form a second implanted region within the substrate laterally separated from the first implanted region by a first region, wherein the dielectric material extends from over a first side of the first region to over a second side of the first region.

17. The method of claim 16, wherein the performing the first implantation forms an isolation region.

18. The method of claim 17, wherein the performing the second implantation forms a source/drain region.

19. The method of claim 18, further comprising forming a gate stack from the mask layer.

20. The method of claim 16, wherein the performing the first implantation implants oxygen.

21. The method of claim 16, wherein the first region has a width of between about 0.02 µm and about 0.2 µm.

22. The method of claim 16, further comprising forming a photodiode adjacent to the first implanted region.

23. The method of claim 16, wherein the lowermost portion of the dielectric material is part of a horizontal portion of the dielectric material, and wherein a horizontal width of the first implanted region within the substrate is constrained to be within and less than a horizontal width of the horizontal portion of the dielectric material.

* * * * *